US008584613B2

(12) United States Patent  
Kholodenko et al.

(10) Patent No.: US 8,584,613 B2
(45) Date of Patent: Nov. 19, 2013

(54) SINGLE SUBSTRATE PROCESSING HEAD FOR PARTICLE REMOVAL USING LOW VISCOSITY FLUID

(75) Inventors: Arnold Kholodenko, San Francisco, CA (US); Cheng-yu Lin, Sunnyvale, CA (US); Leon Ginzburg, Santa Clara, CA (US); Mark Mandelboym, Santa Clara, CA (US); Gregory A. Tomasch, Kelseyville, CA (US); Anwar Husain, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1083 days.

(21) Appl. No.: 12/165,577

(22) Filed: Jun. 30, 2008

(65) Prior Publication Data

US 2009/0320942 A1 Dec. 31, 2009

(51) Int. Cl.
*B05C 5/02* (2006.01)

(52) U.S. Cl.
USPC ........... 118/313; 118/315; 118/411; 118/412; 118/429; 239/550; 239/553; 239/553.3; 239/553.5; 239/554; 134/198; 137/561 A

(58) Field of Classification Search
USPC .......... 118/313, 315, 411, 412, 429; 427/356; 239/550, 553, 553.3, 553.5, 554, 566; 137/561 A; 425/72.2, 382.2, 464; 134/198; 68/205 R See application file for complete search history.

(56) References Cited

U.S. PATENT DOCUMENTS

| | | | | |
|---|---|---|---|---|
| 4,276,011 A | * | 6/1981 | Siegman et al. | 425/198 |
| 5,618,566 A | * | 4/1997 | Allen et al. | 425/7 |
| 5,836,520 A | * | 11/1998 | Bhandarkar et al. | 239/553.5 |
| 6,220,843 B1 | * | 4/2001 | Allen | 425/7 |
| 2003/0102385 A1 | | 6/2003 | Nguyen | |
| 2005/0260789 A1 | * | 11/2005 | M. Cruz et al. | 438/106 |
| 2006/0254078 A1 | | 11/2006 | O'Donnell | |
| 2007/0125400 A1 | | 6/2007 | Matsui | |
| 2008/0038448 A1 | | 2/2008 | Kholodenko et al. | |

FOREIGN PATENT DOCUMENTS

WO  WO 2006/137800  12/2006

* cited by examiner

*Primary Examiner* — Laura Edwards
(74) *Attorney, Agent, or Firm* — Martine Penilla Group, LLP

(57) ABSTRACT

A head for dispensing a thin film over a substrate is disclosed. The head includes a body assembly that extends between a first and a second end that is at least a width of the substrate. The body includes a main bore that is defined between the first and the second ends, the main bore connected to an upper side of a reservoir through a plurality of feeds that are defined between the main bore and the reservoir. The body also includes a plurality of outlets connected to a lower side of the reservoir and extend to an output slot. The plurality of feeds have a larger cross-sectional area than the plurality of outlets and the plurality of feeds are fewer than the plurality of outlets. Wherein fluid is configured to flow through the main bore, through the plurality of feeds along the bore and fill the reservoir up to at least the threshold level before fluid is evenly output as a film out of the output slot onto the substrate.

6 Claims, 23 Drawing Sheets

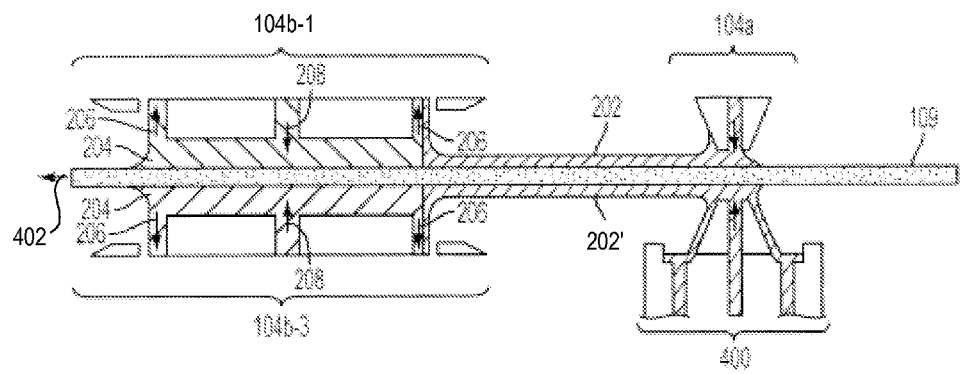
FIG. 4A
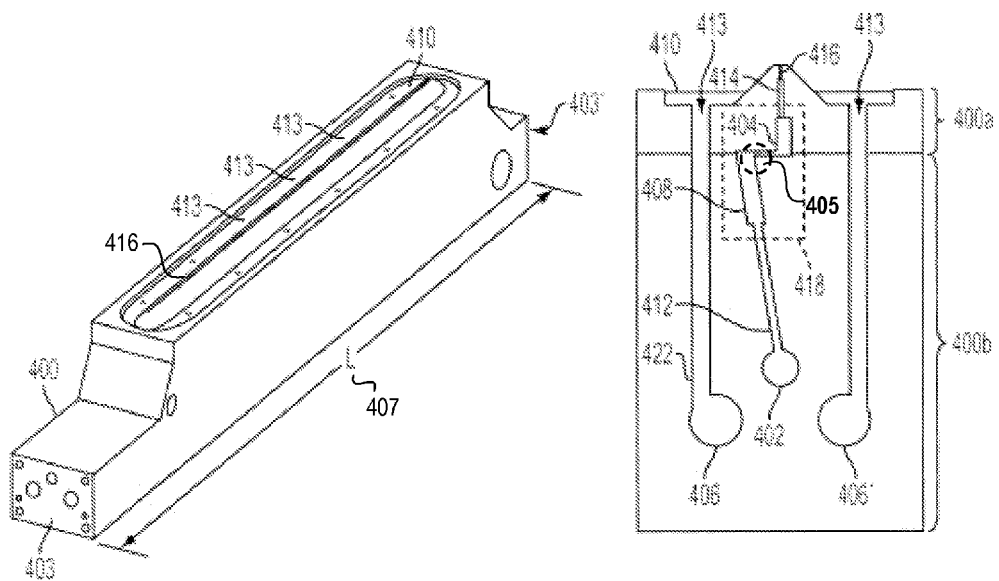
FIG. 4B
FIG. 4C

SINGLE SUBSTRATE PROCESSING HEAD FOR PARTICLE REMOVAL USING LOW VISCOSITY FLUID

CROSS REFERENCE TO RELATED APPLICATION

This Application is related to application Ser. No. 12/324,316, filed on Nov. 26, 2008, and entitled "CONFINEMENT OF FOAM DELIVERED BY A PROXIMITY HEAD" that is currently pending.

BACKGROUND

Cleaning operations are becoming more critical during the manufacture of semiconductor wafers. Due to the changing nature of the manufacturing operations and the continuing quest to further reduce feature sizes timely removal of particulate material from semiconductor substrate is critical. Specialized fluids have been developed to effectuate particle removal from substrates while minimizing potential damage to sensitive electronic structures formed on the substrate. As the specialized fluids can be costly it is desirable to minimize their consumption during substrate processing. Similarly, is it desirable to minimize downtime of substrate processing facilities by having a robust system that minimizes process variations.

Accordingly, there is a need to provide a robust substrate cleaning system that minimizes consumption of substrate cleaning fluids.

SUMMARY

A process module that applies a thin film of fluid to a substrate is disclosed. Fluid is supplied to the process module through a manifold. The fluid travels through a main bore that is intersected by a plurality of feeds. The plurality of feeds have various cross-sectional areas and allow fluid to flow from the main bore into a reservoir with a plurality of outlets. Surface tension prevents the fluid from freely flowing through the outlets. The various cross-sectional areas allows the reservoir to fill at a substantially constant rate across the length of the process module. When the fluid within the reservoir exceeds a determined volume, the fluid within the outlets overcomes the surface tension and beings flowing through the outlets and into an outlet slot. The outlet slot allows the fluid to be output from the process module as a thin film of fluid onto the surface of the substrate.

In one embodiment, an apparatus to distribute fluid material to a surface of a substrate is disclosed. The apparatus includes a body that extends a length between a first end and a second end, the length being greater than a width of the substrate. The body includes a main bore that extends between the first end and the second end, and is configured to couple to a delivery manifold. The body also includes a body channel that extends between the first end and the second end, and is substantially parallel to the main bore. Also included in the body are a plurality of feeds that connect the main bore and the body channel, where the body channel extends to a body interface surface of the body. The apparatus also includes a face plate that extends between the first end and the second end of the body and has a face plate interface surface that is configured to mate with the body interface surface. The face plate includes a face plate channel that extends between the first end and the second end of the body. Also included on the face plate is a face plate channel that is substantially parallel to the main bore. The face plate channel is defined at the face plate interface surface so that mating the body interface surface and the face plate interface surface defines a reservoir that couples to the feeds. The face plate also includes a plurality of outlets that extends between the first end and the second end of the body and is coupled between an outlet slot that is oriented opposite the face plate interface surface. Wherein the fluid material is configured to flow from the delivery manifold to the main bore, to the feeds, into the reservoir, through the outlets and onto the surface of the substrate through the outlet slot.

In another embodiment, an applicator to deliver a fluid to a substrate is disclosed. The applicator includes a main bore that extends between ends of the apparatus. The applicator also includes a reservoir that extends between ends of the apparatus where the reservoir is substantially parallel to the main bore. Also included in the applicator are a plurality of feeds that connect the main bore and the reservoir along with a plurality of outlets that connect the reservoir to an exterior of the apparatus. The applicator also has an outlet slot that connects the plurality of outlets, wherein the fluid is delivered through the main bore, through the plurality of feeds, to the reservoir, through the outlets to the outlets slot and onto the substrate as the substrate is moved within a channel adjacent to the outlet slot.

In yet another embodiment, a head for dispensing a thin film over a substrate is disclosed. The head includes a body assembly that extends between a first and a second end that is at least a width of the substrate. The body includes a main bore that is defined between the first and the second ends, the main bore connected to an upper side of a reservoir through a plurality of feeds that are defined between the main bore and the reservoir. The body also includes a plurality of outlets connected to a lower side of the reservoir and extend to an output slot. The plurality of feeds have a larger cross-sectional area than the plurality of outlets and the plurality of feeds are fewer than the plurality of outlets. Wherein fluid is configured to flow through the main bore, through the plurality of feeds along the bore and fill the reservoir up to at least the threshold level before fluid is evenly output as a film out of the output slot onto the substrate.

In still another embodiment, a chamber for processing a substrate is disclosed. The chamber includes a substrate carrier configured to slide horizontally within the chamber. Also included in the chamber is a fluid dispense head oriented below a path of the substrate carrier. The fluid dispense head includes an outlet slot that has a width that extends at least a width of the substrate. The fluid dispense head also includes a recovery area that surrounds the outlet slot where the recovery area is connected to a recycle conduit. Wherein fluid out from the main delivery nozzle is directed upward toward a direction of an underside of the substrate when present, so as to deliver a substantially uniform film on the substrate and the recovery area recovers fluid not defining the film.

Other aspects and advantages of the invention will become apparent from the following detailed description, taken in conjunction with the accompanying drawings, illustrating by way of example the principles of the invention.

BRIEF DESCRIPTION OF THE DRAWINGS

Aspects of the present invention will become apparent from the following detailed description, taken in conjunction with the accompanying drawings, illustrating by way of example the principles of the invention.

FIG. 3F-1 illustrates various configurations of feeds along the length of main bore, in accordance with one embodiment of the present invention.

FIG. 3F-2 illustrates experimental results of outlet velocities across the width of an upper applicator with fixed cross-sectional area feeds and an upper applicator with varying cross-sectional areas feeds, in accordance with one embodiment of the present invention.

FIGS. 3G-1 through 3G-8 illustrate an exemplary fluid flow through a cross-sectional area of one outlet port of the upper applicator in accordance with one embodiment of the present invention.

FIG. 4A is a simplified illustration of fluid interfaces between the substrate, upper applicators, and a lower applicator, in accordance with one embodiment of the present invention.

FIG. 4B is a simplified perspective view of an exemplary lower applicator, in accordance with one embodiment of the present invention.

FIG. 4C is a diagram illustrating a cross-sectional area of the lower applicator and FIG. 4D is a simplified schematic illustrating detail 418, in accordance with one embodiment of the present invention.

FIG. 5 is a simplified diagram illustrating a fluid recycling system used in conjunction with lower applicator, in accordance with one embodiment of the present invention.

DETAILED DESCRIPTION

The embodiments described herein provide for a system in which a film of fluid is applied evenly across a substrate. The fluid is supplied to a main bore of an applicator body via a manifold. The main bore is intersected by multiple feeds, in one embodiment, the multiple feeds have various cross-sectional areas to restrict of enhance the flow of the fluid based on the feeds position on the main bore. The fluid flows from the feeds into a reservoir with multiple outlets. The outlets allow the fluid to be dispensed from the reservoir across the surface of the substrate via an outlet slot. The outlet slot joins the multiple outlets and distributes the fluid across the width of the substrate.

Figure 1A:
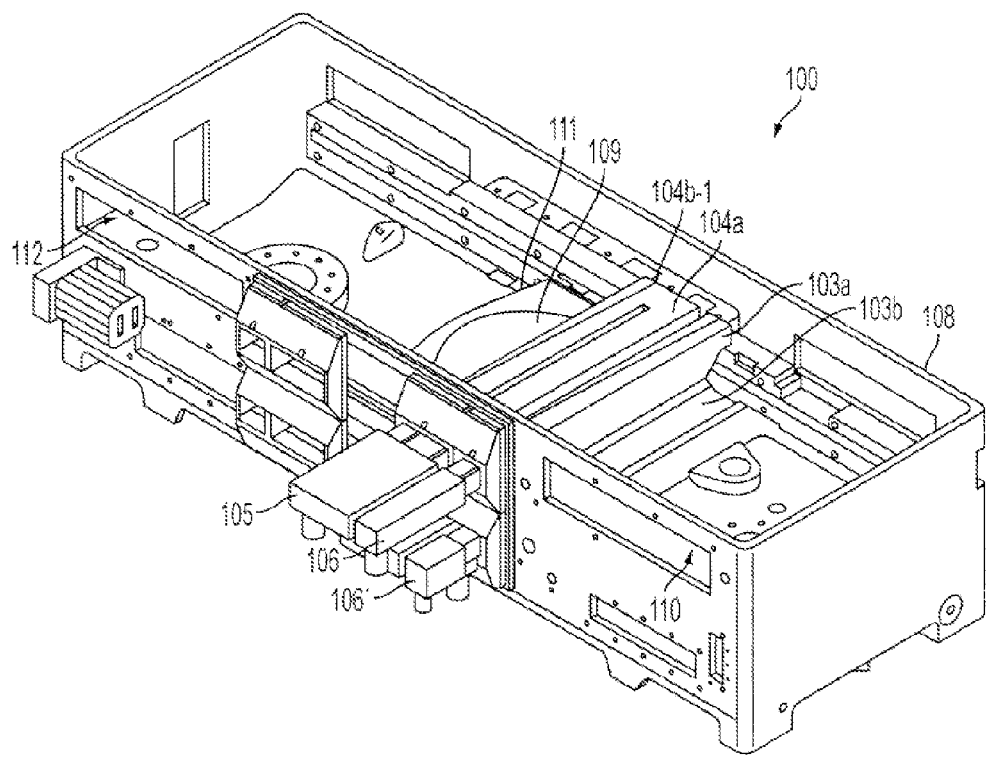
FIG. 1A is a simplified perspective diagram illustrating an applicator body within a process module in accordance with one embodiment of the invention.

FIG. 1A is a simplified perspective diagram illustrating an applicator body 104a within a process module 100 in accordance with one embodiment of the invention. The exemplary process station 100 includes a process chamber 108 that is configured to accommodate upper applicator bodies 103a, 104a and 104b. The upper applicator bodies 104a and 104b are coupled to upper manifold 105 while upper applicator body 103a is coupled to upper manifold 106. Also visible in FIG. 1A is lower applicator body 103b that is connected to lower manifold 106'. Though not shown, a channel can be formed between the upper applicator bodies 104a and 104b and respective lower applicator body counterparts that are connected to a lower manifold. The process chamber 108 includes an input 110 and an output 112. A carrier 111 moves a substrate 109 between the input 110 and the output 112 through a channel formed between the upper applicator bodies 103a, 104a, 104b and the lower applicator bodies 103, and the respective lower applicator bodies associates with the upper applicator bodies. Additional information regarding the chamber body can be found in U.S. patent application Ser. No. 11/731,075 filed on Mar. 30, 2008 entitled "CHEMICAL RESISTANT SEMICONDUCTOR PROCESSING CHAMBER BODIES", (U.S. Publication No. US 2008-0038448, since abandoned) which is incorporated herein by reference.

Figure 1B:
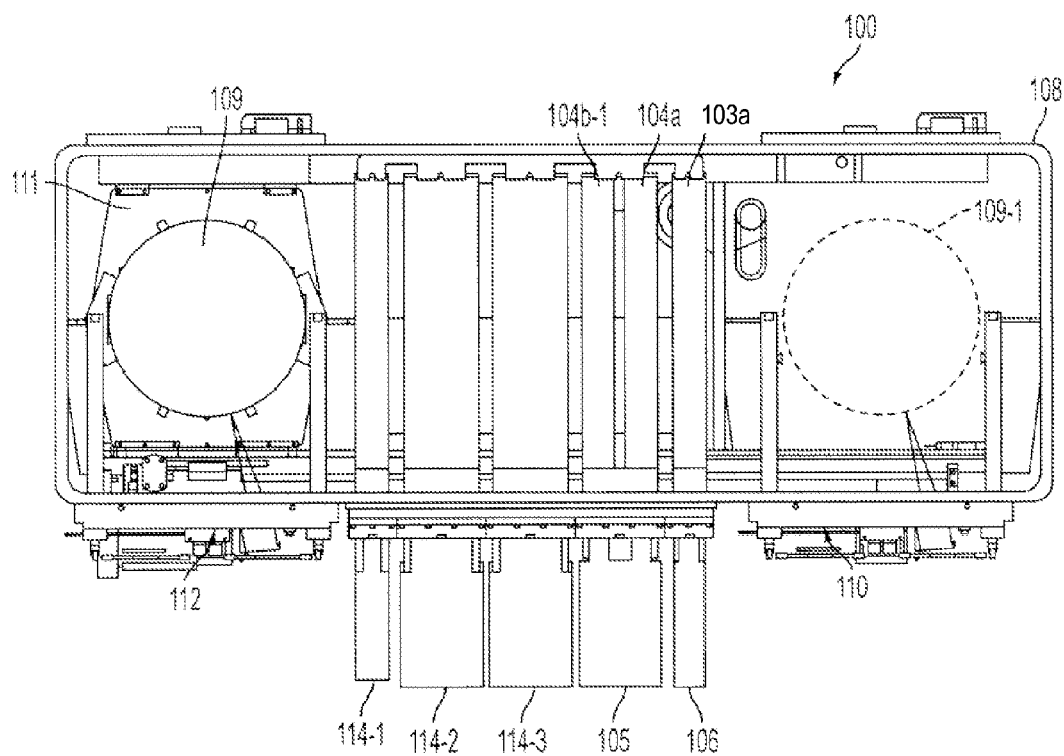
FIG. 1B is a simplified schematic illustrating a top view of the process station, in accordance with one embodiment of the present invention.

FIG. 1B is a simplified schematic illustrating a top view of the process station 100, in accordance with one embodiment of the present invention. In this embodiment, the carrier 111 is positioned so the substrate 109 can be withdrawn from the process chamber 108 through the output 112. Within the process chamber 108, carrier return position 109-1 indicates where the carrier 111 will return so another substrate can be loaded onto the carrier. The upper applicator 103a is shown attached to the upper manifold 106. Similarly, the upper applicator bodies 104a and 104b-1 can be seen attached to upper manifold 105. In another embodiment, upper applicator bodies 104a and 104b-1 may have separate manifolds. In still other embodiments, upper applicators 103a, 104a, and 104b-1 may share a single upper manifold. In the embodiment illustrated in FIG. 1B, process modules 114-1, 114-2 and 114-3 perform various process operations to a substrate 109 as it traverses the process chamber 108. Each process modules 114-1, 114-2 and 114-3 can form a channel (not shown) where process gases, fluids, solids, and mixtures thereof can be applied to the substrate 109. For example, before the substrate 109 is carried to the output 112, process module 114-1 can clean and dry the substrate 109. Process modules 114-2 and 114-3 can be used for, but not limited to, plating, cleaning, and other substrate processes. In one embodiment, upper applicator 104a is applies a process fluid to the surface of the substrate 109 while upper applicators 104b-1 performs and rinse and clean operation. In one embodiment, the process fluid is a low viscosity fluid that includes fatty acids to assist in particulate removal. The process fluid is intended to be exemplary and should not be construed as limiting as additional process fluids can be used based on the process performed to the substrate 109. As will be discussed below, lower applicators can be also be used to apply process fluids to an opposite side of the substrate 109.

Figure 1C:
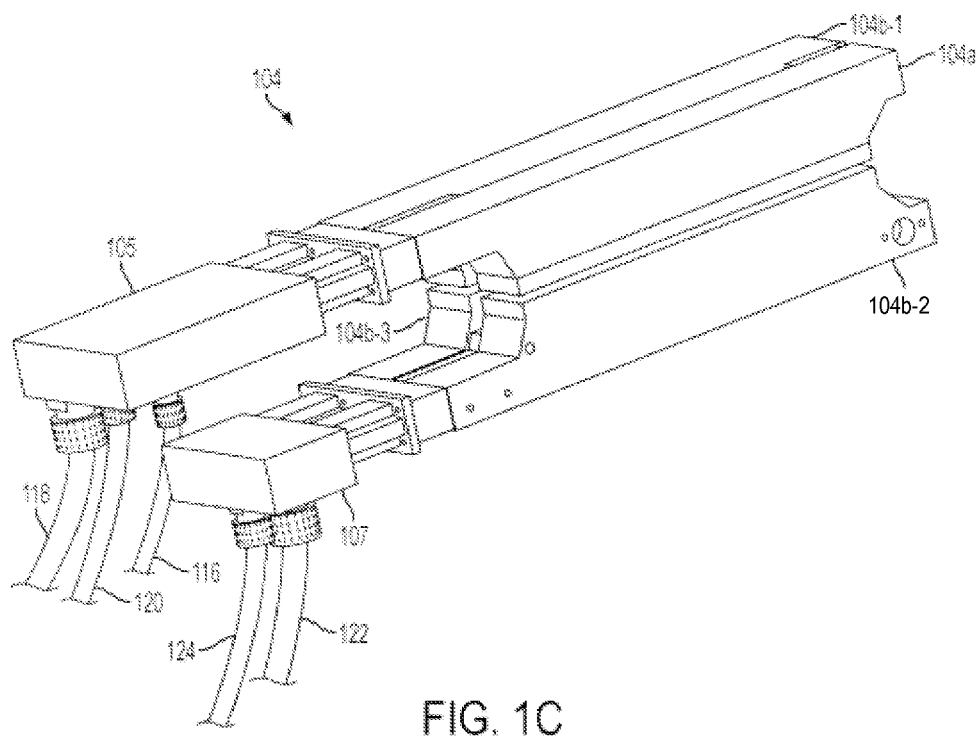
FIG. 1C illustrates upper applicators connected to an upper manifold along with lower applicators connected to la ower manifold, in accordance with one embodiment of the present invention.

FIG. 1C illustrates upper applicators 104*a* and 104*b*-1 connected to upper manifold 105 along with lower applicators 106*a* and 106*b* connected to lower manifold 107, in accordance with one embodiment of the present invention. The upper manifold 105 has supply lines 116, 118, and 120 that are used to supply fluids to the upper applicators 104*a* and 104*b*-1. Similarly, the lower manifold 107 has supply lines 122 and 124 that supply fluid to lower applicators 104*b*-2 and 104*b*-3. In one embodiment, the supply line 116 is used to supply fluids to the upper applicator 104*a* while the supply lines 118 and 120 supply fluids to the upper applicators 104*b*-1. In one embodiment the supply lines 118, 120, 122, and 124 can provide fluids such as, but not limited to, deionized water, isopropyl alcohol, or combinations thereof. The supply lines 118, 120, 122, and 124 can also be used to supply fluids such as nitrogen gas, or be used to draw a vacuum in order to remove fluids through the upper applicator 104*b*-1, 104*b*-2 and 104*b*-3. The specific examples of fluids that can be supplied to the upper manifold 105 and the lower manifold 107 are not intended to be exhaustive nor limiting. Furthermore, other embodiments of the upper manifold 105 and the lower manifold 107 can have additional or fewer supply lines.

Figure 1D:
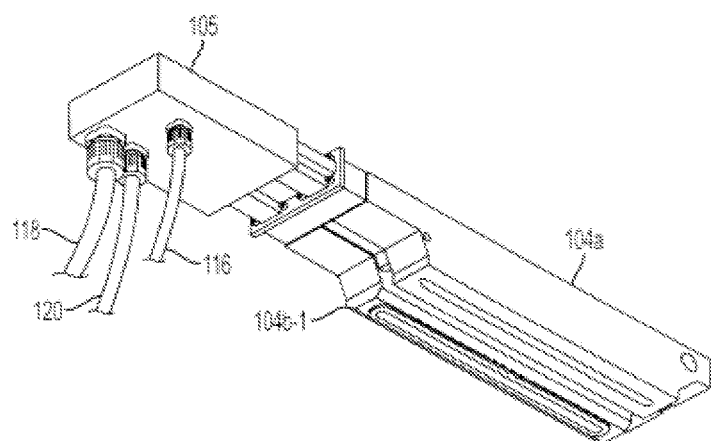
FIG. 1D illustrates the a schematic representation of an exemplary underside of upper applicators in addition to upper manifold, in accordance with one embodiment of the present invention.

FIG. 1D illustrates the a schematic representation of an exemplary underside of upper applicators 104*a* and 104*b*-1 in addition to upper manifold 105, in accordance with one embodiment of the present invention. As previously discussed, supply line 116 supplies fluid through upper manifold 105 to upper applicator 104*a*. Similarly, supply lines 118 and 120 supply fluids and/or vacuum to upper applicator 104*b*-1 via upper manifold 105. Within upper manifold 105 fluids can be conditioned before being supplied to upper applicators 104*a* or 104*b*-1. For example, upper manifold 105 can be used to mix fluids supplied separately through supply lines 118 and 120. In other embodiments, supply lines 118 and 120 can carry fluids that are mixed within upper manifold 105 to generate foams. In other embodiments, upper applicator 104*a* can have multiple supply lines supply a variety of fluids through the upper manifold 105.

Figure 1E:
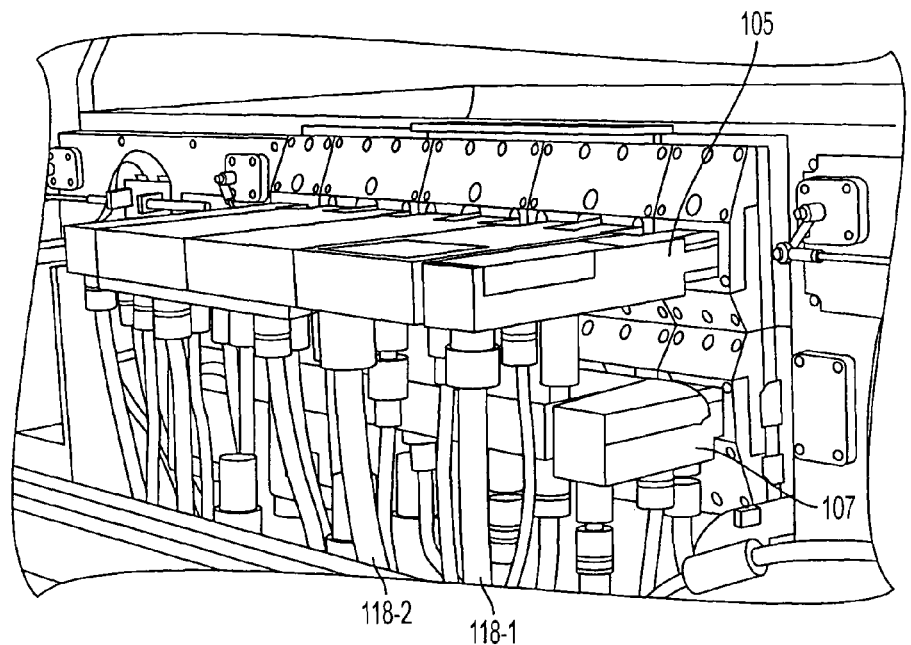
FIG. 1E is an exemplary illustration of a test bench with multiple examples of upper manifold and lower manifold, in accordance with one embodiment of the present invention.

FIG. 1E is an exemplary illustration of a test bench with multiple examples of upper manifold 105 and lower manifold 107, in accordance with one embodiment of the present invention. The illustration shows an exemplary embodiment where various manifolds have a variety of supply lines. The manifolds associated with supply lines 118-1 and 118-2, are used to evacuate fluid from the associated applicator, as indicated by the arrow on the supply lines 118-1 and 118-2. Similarly, arrows on other supply lines indicate that fluid is supplied into the manifold and associated applicator. The test bench setup shown in FIG. 1E should not be construed as limiting as fewer or more manifolds and the associated applicators can be used depending on the substrate process operation being performed.

Figure 1F:
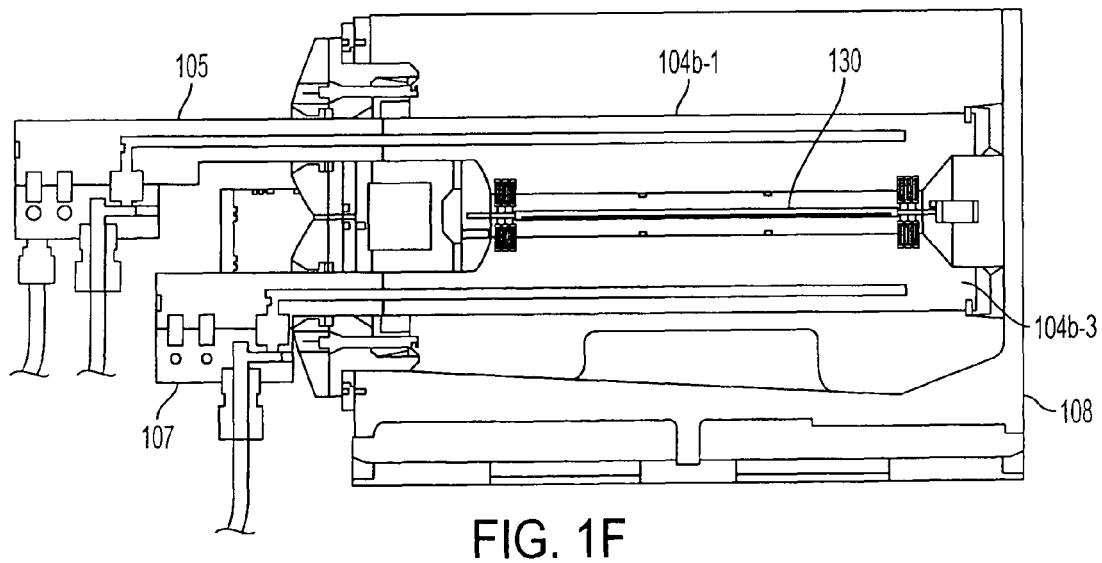
FIG. 1F is an exemplary cross-section view of the process chamber along with upper applicator and lower applicator, in accordance with one embodiment of the present invention.

FIG. 1F is an exemplary cross-section view of the process chamber 108 along with upper applicator 104*b*-1 and lower applicator 104*b*-3, in accordance with one embodiment of the present invention. The upper manifold 105 and lower manifold 107 are also visible along with various supply lines. A channel 130, where the substrate passes through on the carrier, is formed between the upper applicator 104*b*-1 and the lower applicator 104*b*-3.

Figure 2A:
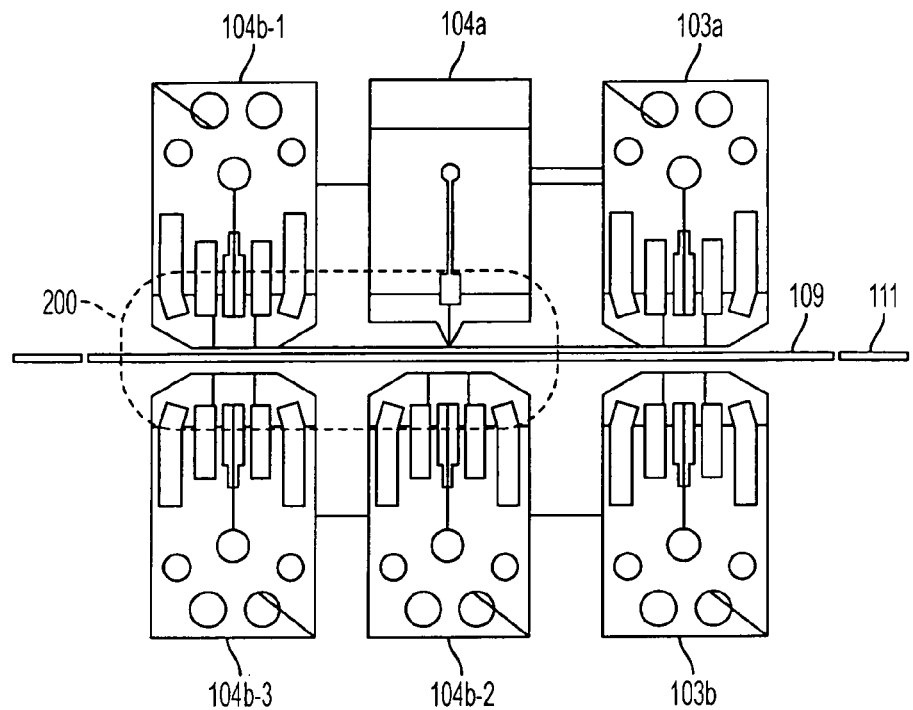
FIG. 2A is an exemplary schematic illustrating cross sections of upper applicators along with lower applicators, in accordance with one embodiments of the present invention.

FIG. 2A is an exemplary schematic illustrating cross sections of upper applicators 104*a* and 104*b*-1 along with lower applicators 106*a* and 106*b*, in accordance with one embodiments of the present invention. The carrier 111 moves a substrate 109 through a channel formed between upper applicators 104*b*-1, 104*a*, 103 and lower applicators 104*b*-2, 104*b*-3, 103. In one embodiment, upper applicator 103*a* and lower applicator 103*b* form a preparation module that dispenses deionzied water or other surface preparation fluids. In other embodiments, the upper applicator 103*a* and 103*b* are optional so the carrier 111 and the substrate 109 pass through a channel formed by upper applicators 104*a* and 104*b*-1 and lower applicators 104*b*-2 and 104*b*-3. Process area 200 highlights an area where the substrate 109 is exposed to fluids from upper applicators 104*a* and 104*b*-1 and lower applicators 104*b*-2 and 104*b*-3.

Figure 2B:
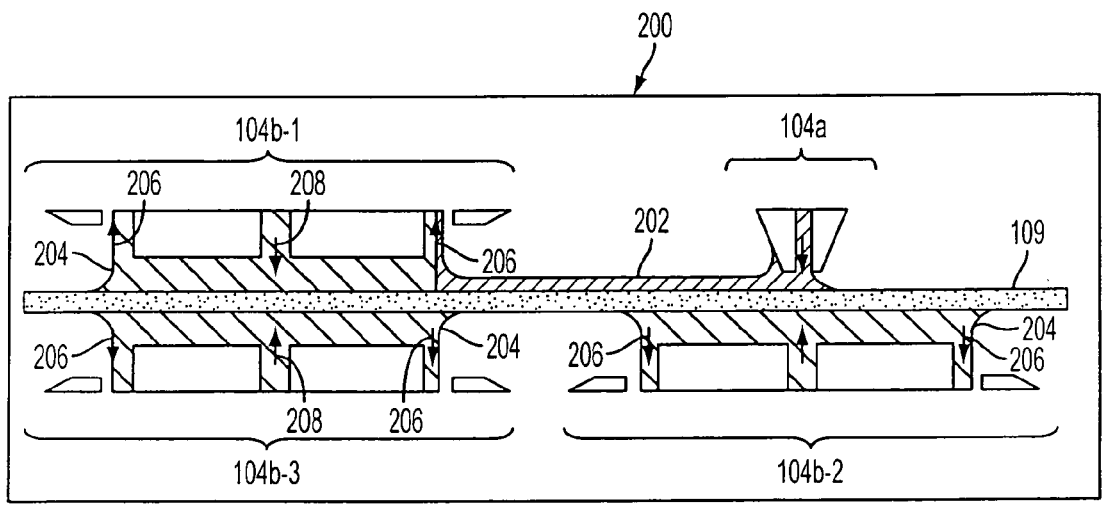
FIG. 2B is a simplified illustration of the process area, in accordance with one embodiment of the present invention.

FIG. 2B is a simplified illustration of the process area 200, in accordance with one embodiment of the present invention. The process area 200 illustrates one embodiment of fluid application to the substrate 109 from upper applicators 104*a* and 104*b*-1 and lower applicators 104*b*-2 and 104*b*-3. In this embodiment, upper applicator 104*b* and lower applicators 104*b*-2 and 104*b*-3 rinse and dry the substrate 109. Upper applicator 104*b* and lower applicators 104*b*-2 and 104*b*-3 have a dispense port 208 and vacuum ports 206. In one embodiment, dispense port 208 is used to apply a fluid such as de-ionized water to the substrate 209. A vacuum is drawn through vacuum ports 206 to remove fluid applied via dispense port 208.

FIG. 2B also illustrates upper applicator 104*a* applying fluid 202 to the substrate 109. In one embodiment, the upper applicator 104*a* provides uniform flow delivery across the substrate 109. Depending on the type of fluid being delivered and the speed of the carrier under the upper applicator 104*a*, fluid can be supplied to the substrate 109 between a range of about 20 cc/min to 500 cc/min. The upper applicator 104*a* precisely dispenses a film of fluid when turned on and fluid surface tension prevents dripping or leaking of fluid from the upper applicator 104*a* when fluid flow through the manifold (not shown) is turned off.

Figure 2C:
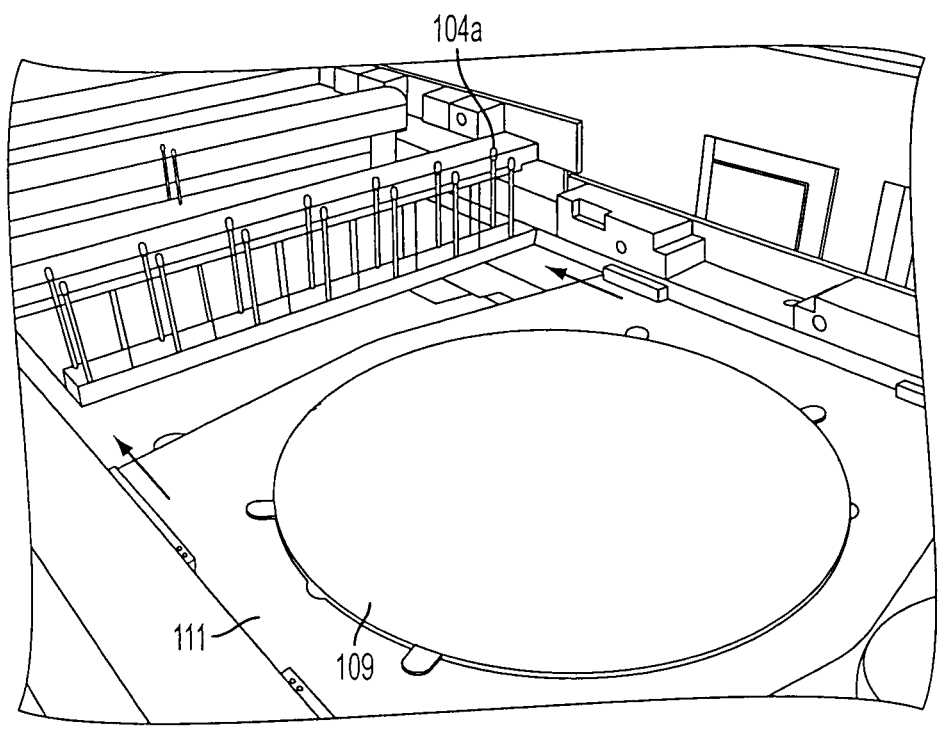
FIGS. 2C-2E are exemplary illustrations showing a test bench of a substrate passing under an upper applicator in accordance with one embodiment of the present invention.
Figure 2D:
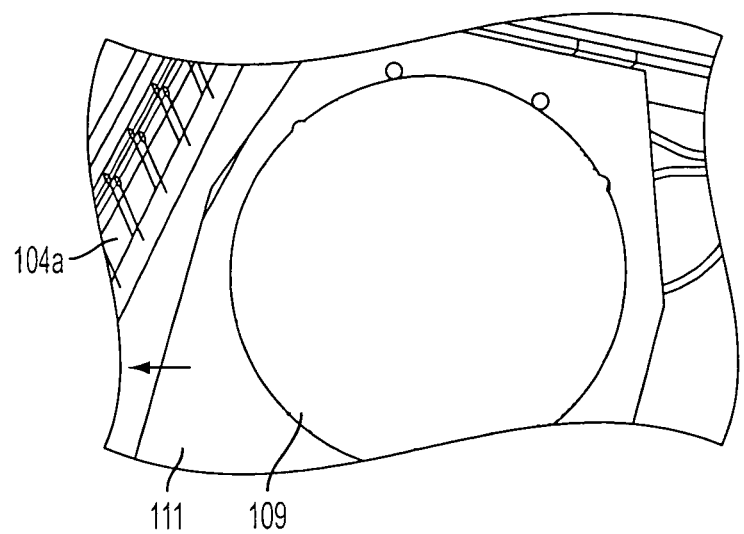
Figure 2E:
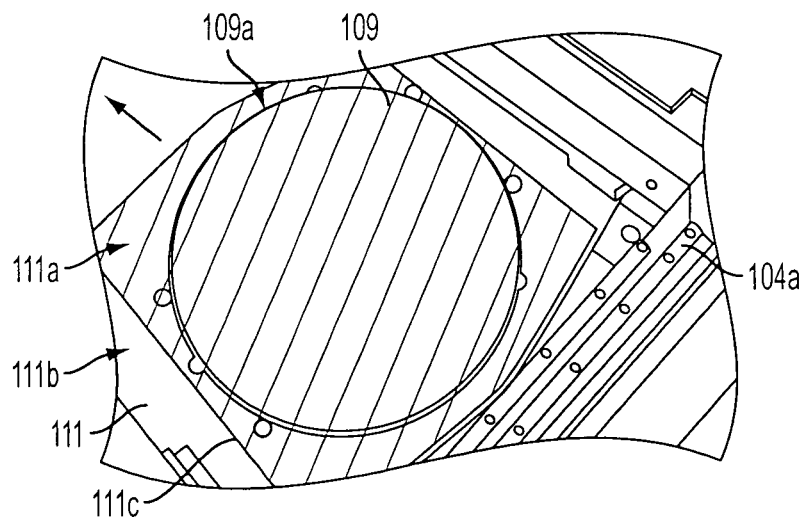

FIGS. 2C-2E are exemplary illustrations showing a test bench of a substrate 109 passing under an upper applicator 104*a* in accordance with one embodiment of the present invention. In FIGS. 2C and 2D show the carrier 111 and the substrate 109 before fluid is applied to substrate 109 by upper applicator 104*a*. The mirror like finish of the substrate 109 illustrates that fluid has not be applied to the substrate 109. FIG. 2E is an illustration of the substrate 109 after fluid is applied by the upper applicator 104*a*. The fluid has been applied to the substrate 109 and the carrier 111 resulting in a coated area 111*a* and an uncoated area 111*b*. In this embodiment, to ensure the fluid completely covers the substrate, the coated area 111*a* encompasses an area larger than the substrate 109. In other embodiments, in order to minimize consumption of fluids applied by the upper applicator 104*a*, the coated area 111*a* can encompass an area closer to an edge of the substrate 109*a*. FIG. 2E also illustrates an edge 111*c* delineating the coated area 111*a* from the uncoated area 111*b*. The distinct edge is a result of the controlled dispensation of a film of fluid from the upper applicator 104*a*.

Figures 1, 2F:
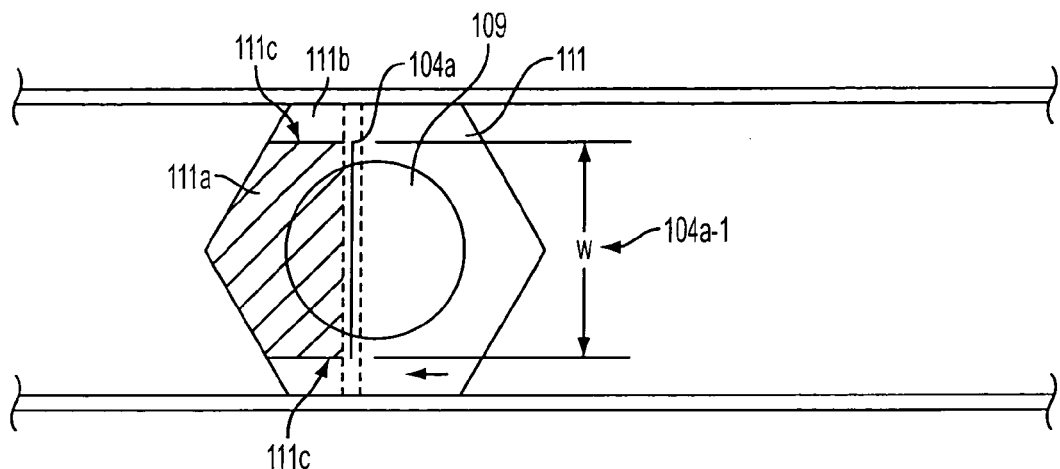
FIGS. 2F-1 and 2F-2 are simplified schematics illustrating a top view of the upper applicator applying a fluid to the substrate and the carrier, in accordance with one embodiment of the present invention.
Figures 2, 2F:
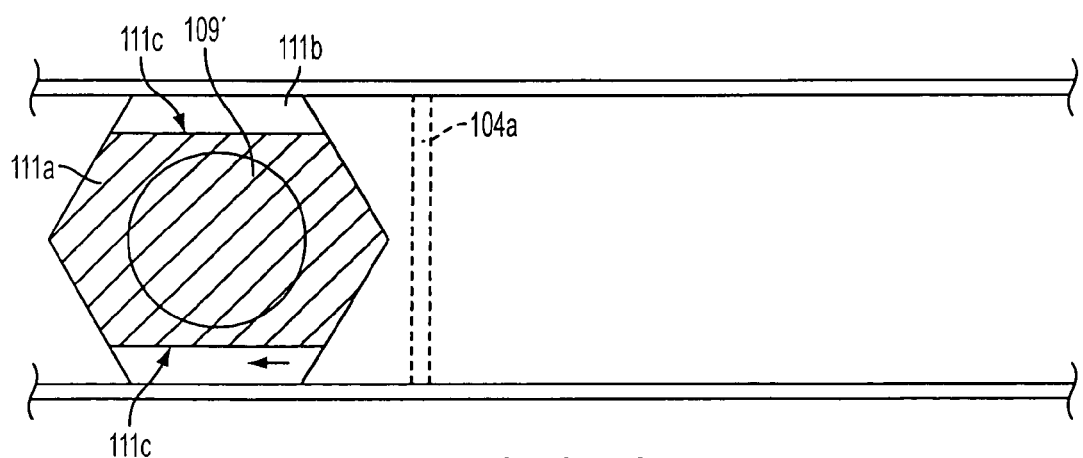

FIGS. 2F-1 and 2F-2 are simplified schematics illustrating a top view of the upper applicator 104*a* applying a fluid to the substrate 109 and the carrier 111, in accordance with one embodiment of the present invention. The upper applicator 104*a* controls fluid dispensation across a width 104*a*-1 as the carrier 111 and substrate 109 pass beneath the upper applicator 104*a*. The defined width 104*a*-1 results in the coated area 111*a* and the uncoated area 111*b*. The edge 111*c* illustrates the delineation between the coated area 111*a* and the uncoated area 111. The edge 111c also illustrates that fluid dispensation from the upper applicator 104a is controlled so as to minimize consumption of fluids in order to prevent excessive fluid application that would result in runoff. As discussed below, features of the upper applicator 104a control fluid flow so fluid is evenly distributed across a width 104a-1.

Figure 3A:
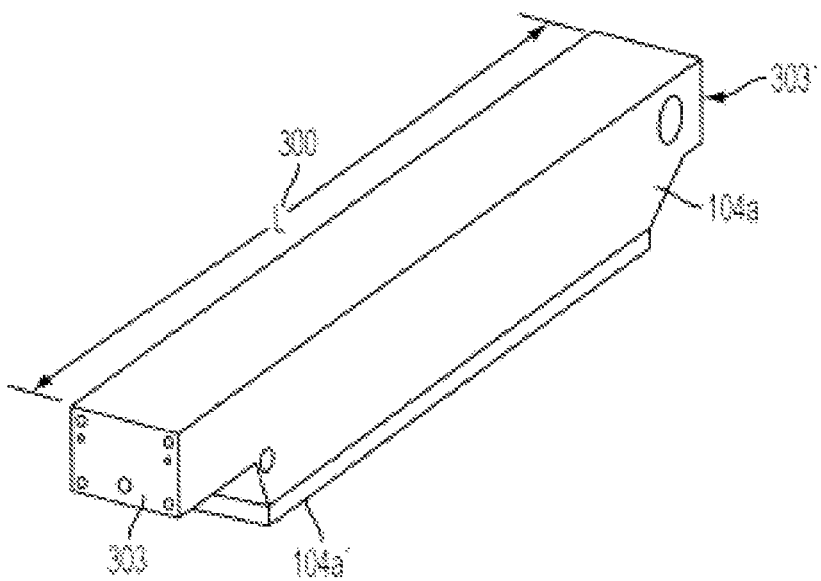
FIGS. 3A and 3B are exemplary illustrations of the upper applicator in accordance with one embodiment of the present invention.
Figure 3B:
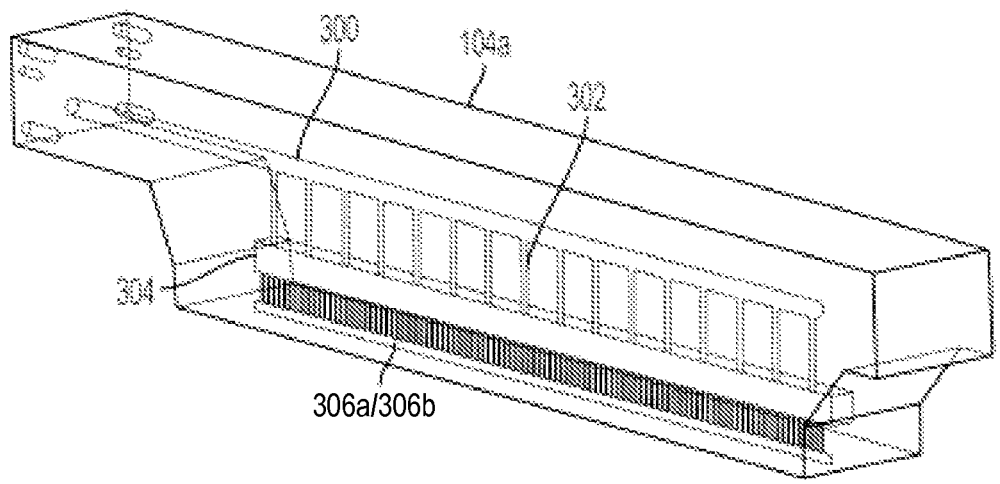

FIGS. 3A and 3B are exemplary illustrations of the upper applicator 104a in accordance with one embodiment of the present invention. The upper applicator 104a includes a main bore 300 that extends from an end 303 but not through an end 303'. The end 303 connects to the upper manifold (not shown) so fluid can be supplied through the upper manifold to the main bore 300. The upper applicator 104a also includes multiple feeds 302 that intersect the main bore 300. The feeds 302 connect the main bore 300 to a reservoir 304. Similarly, outlets 306a connect the reservoir 304 to an outlet slot 306b. The outlet slot 306b that interconnects the individual outlets 306a to assist in evenly distributing the fluid across the substrate.

In operation, fluid supplied through the upper manifold enters the main bore 300. When the fluid within the main bore 300 intersects a feed 302, the fluid flows from the main bore 300 into the reservoir 304. The fluid flows from the reservoir 304 and fills the outlets 306a. When a volume of fluid collets within the reservoir the fluid flows from the outlets into the outlet slot 306b and is evenly distribute on the substrate. A volume of fluid necessary to initiate fluid flow from the outlets is based on various parameters such as, but not limited to, fluid viscosity, surface tension of the fluid, and the physical size of outlets 306a. When fluid flow to the main bore 300 is stopped, fluid flow from the outlets stops.

Figure 3C:
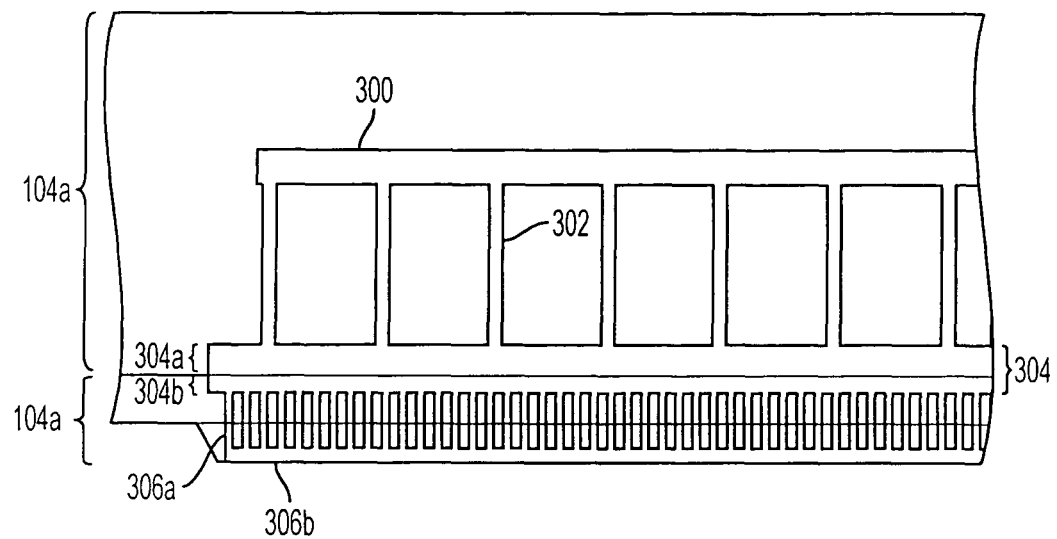
FIG. 3C and 3D are simplified illustration of an exemplary internal configuration of the upper applicator, in accordance with one embodiment of the present invention.
Figure 3D:
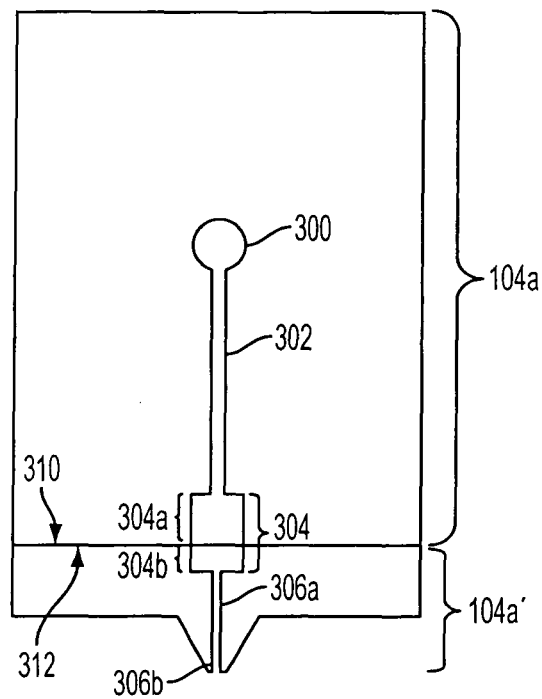

FIG. 3C and 3D are simplified illustration of an exemplary internal configuration of the upper applicator 104a, in accordance with one embodiment of the present invention. FIGS. 3C and 3D illustrate cross-sectional areas of the upper applicator 104a, in accordance with one embodiment of the present invention. In the embodiment illustrated, the upper applicator 104a is an assembly that includes a body 104a and a faceplate 104a'. The different shading of the body 104a and the faceplate 104a' is to provide clarity that the components are formed separately. Various methods can be used to secure or adhere the faceplate 104a' to the body 104a such as, but not limited to, mechanical fasteners, adhesives or combinations thereof. The body 104a has the main bore 300, feeds 302 and a faceplate interface surface 310. The faceplate 104a' has the outlets 306a, the outlet slot 306b and a body interface surface 312. The reservoir 304 is formed when a body channel 304a on the faceplate interface surface 310 is aligned with a faceplate channel 304b on the body interface surface 310.

Figure 3E:
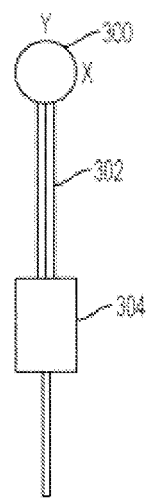
FIG. 3E illustrates exemplary dimensions of various elements within the upper applicator in accordance with one embodiment of the present invention.

FIG. 3E illustrates exemplary dimensions of various elements within the upper applicator 104a in accordance with one embodiment of the present invention. In one embodiment, the outlet 306a is a hole with a diameter of about 0.04 inches and the slot 306b is a channel about 0.03 inches wide centered about the outlet 306a. The measurements provided in this embodiment are based on the application of a fluid with a density of about 1000 kg/m$^3$, a viscosity of about 6.2 cP, and a surface tension of about 26 mN/m. Applications of different fluids may require different embodiments in order to achieve the desired results. In other embodiments Newtonian fluids such as water can be dispensed. In still other embodiments, non-Newtonian fluids such as gels can be dispensed with viscosity ranges from about 1 cP to 60 cP and a surface tension range of about 25 dyn/cm to about 75 dyn/cm.

Figures 1, 3F:
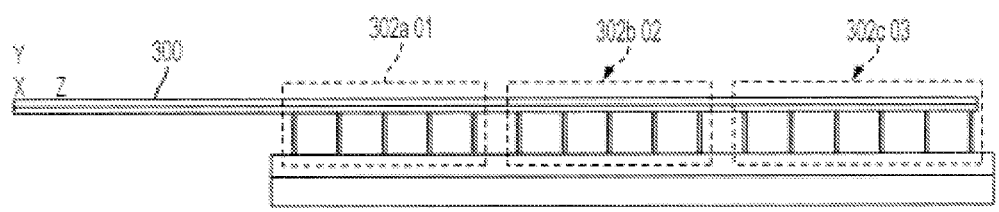
Figures 2, 3F:
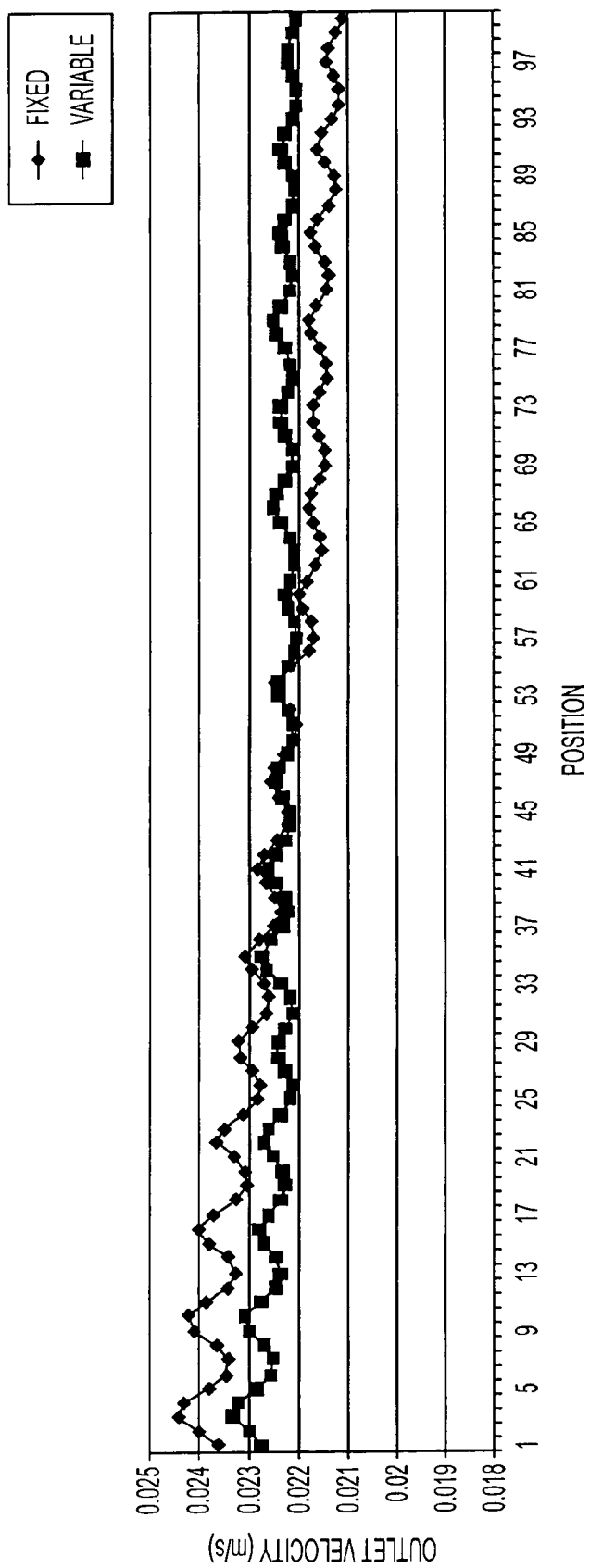

FIG. 3F-1 illustrates various configurations of feeds 302 along the length of main bore 300, in accordance with one embodiment of the present invention. In one embodiment, the feeds 302 vary in cross-sectional area depending on the distance from the end 303. By varying the cross-sectional area of the feeds 302, fluid supplied through the main bore 300 can be evenly distributed across the length of the upper applicator 104a. In FIG. 3F-1, three different cross-sectional areas of feeds 302 are separated into groups of feeds 302a, feeds 302b, and feeds 302c. In such an embodiment the cross-sectional areas of feeds 302a are smaller than feeds 302b, which are smaller than feeds 302c. In one embodiment, the cross-sectional area of the feeds is circular and the feeds 302a have a diameter of about 0.06", feeds 302b have a diameter of about 0.07" and feeds 302c have a diameter of about 0.08". Fluid flow from the main bore 300 is restricted by the smaller diameter of feeds 302a compared to the larger diameter feeds 302c. However, as fluid pressure and fluid volume has decreased before the fluid encounters feeds 302c, the outlet velocity and dispensing rate remains relatively consistent across the outlet slot. In another embodiment, determining a unique cross-sectional area for each individual feed can further optimize fluid flow.

FIG. 3F-2 illustrates experimental results of outlet velocities across the width of an upper applicator with fixed cross-sectional area feeds and an upper applicator with varying cross-sectional areas feeds, in accordance with one embodiment of the present invention. The x-axis represents a position along the width of the upper applicator where zero is closest to the upper manifold and increasing numbers are farther from the upper manifold. Generally speaking, with fixed cross-sectional area feeds, the closer the position to the upper manifold the higher the outlet velocity varying from about 0.0245 m/s at position 3 to about 0.021 m/s at position 100. However, generally speaking, with variable cross-sectional area feeds, the outlet velocity remains more consistent staying within a range between about 0.0234 m/s to about 0.022 m/s. In other embodiments, the outlet velocity for various fluids and various process rates can vary between a range of about 0.01 m/s to about 0.5 m/s.

Figures 1, 3G:
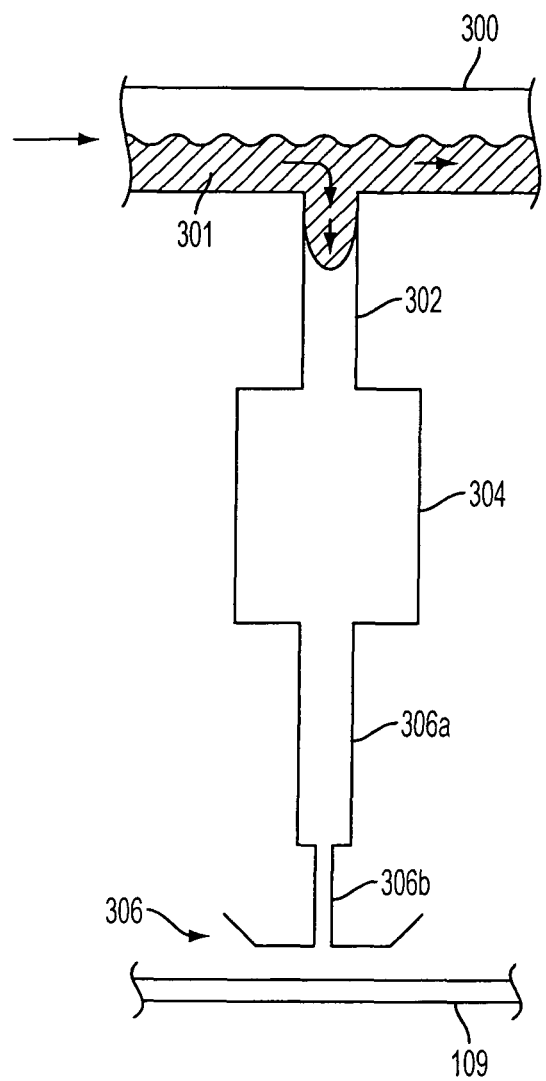
Figures 2, 3G:
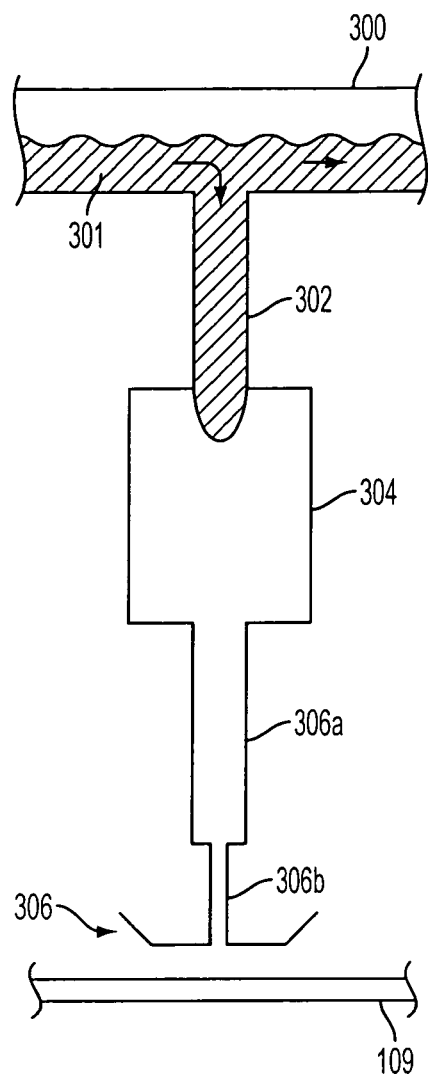
Figures 3, 3G:
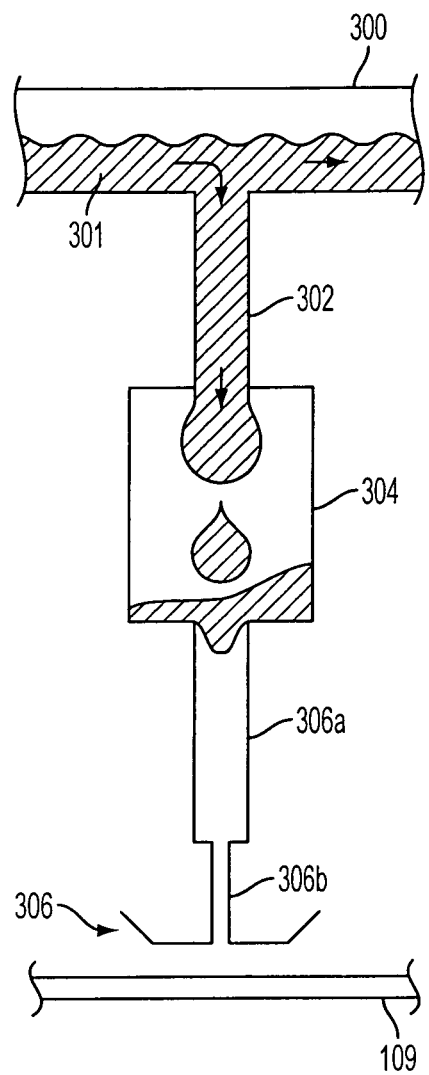

FIGS. 3G-1 through 3G-8 illustrate an exemplary fluid flow through a cross-sectional area of one outlet port of the upper applicator in accordance with one embodiment of the present invention. The sequence illustrate in FIGS. 3G-1 through 3G-7 is exemplary of one feed and occurs sequentially through the feeds interesting the main bore. In FIG. 3G-1 fluid 301 within the main bore 300 has begun to flow through the feed 302. In FIG. 3G-2, the fluid 301 has filled the feed 302 and is shown entering the reservoir 304. In FIG. 3G-3, fluid 301 supplied from the main bore 300 through the feed 302 begins filling the reservoir 304. As fluid 301 collects within the reservoir, the fluid 301 begins traveling down the outlet 306a. At this time, surface tension between the fluid 301 and the walls of the outlet 306a prevent fluid 301 from freely flowing through the outlet 306a.

Figures 3, 3G, 4:
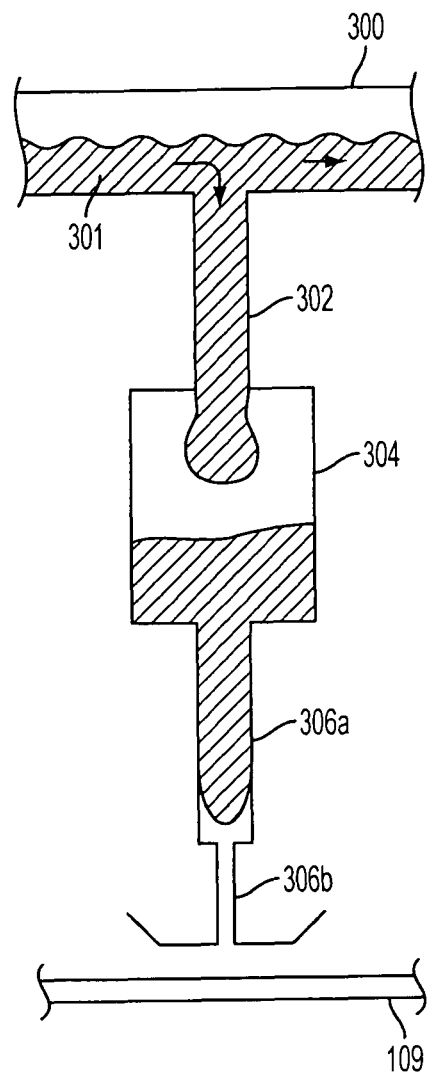

FIG. 3G-4 illustrates fluid 301 continuing to fill the reservoir 304 and fluid 301 almost entirely filling the outlet 306. FIG. 3G-5 shows fluid 301 having entirely filled the outlet 306a and almost the entirety of outlets slot 306b. FIG. 3G-5 also shows fluid 301 having filled the reservoir 304 to a level just below a threshold volume 305. When the fluid 301 within the reservoir 304 exceeds the threshold volume 305, the volume of fluid 310 within the reservoir overcomes the fluid surface tension within the outlet 306a and outlet slot 306b allowing a film of the fluid 301 to flow onto the substrate 109. FIG. 3G-6 illustrates the fluid 301 within the reservoir 304 exceeding the threshold volume 305 resulting in a thin film of fluid being dispensed onto the substrate 109 through the outlet slot 306b. Fluid 301 will continue to be dispensed as long as the fluid level within the reservoir 304 exceeds the threshold volume 305, as illustrated in FIG. 3G-7. The flow rate of fluid within the main bore 301 necessary to maintain the fluid level within the reservoir 304 can vary depending on physical properties of the fluid. Similarly, fluid properties such as viscosity and surface tension can also be used when the cross-sectional areas and configurations of the feeds, outlets, outlet slots and threshold volume. FIG. 3G-8 illustrates that dispensing of fluid from the outlet slot 306b ceases when fluid levels within the reservoir 304 fall below the threshold level 305. As fluid flow within the main bore 301 no longer maintains the fluid within the reservoir above the threshold level 305, fluid flow through the outlet slot stops and surface tension between the fluid and the outlet slot wicks the fluid into the outlet slot and away from the substrate. Thus, when fluid levels within the reservoir 304 fall below the threshold level 305, fluid flow to the substrate stops and the wicking action into the outlet slot prevents the fluid from dripping out of the upper applicator.

Figures 3, 3G, 4, 5:
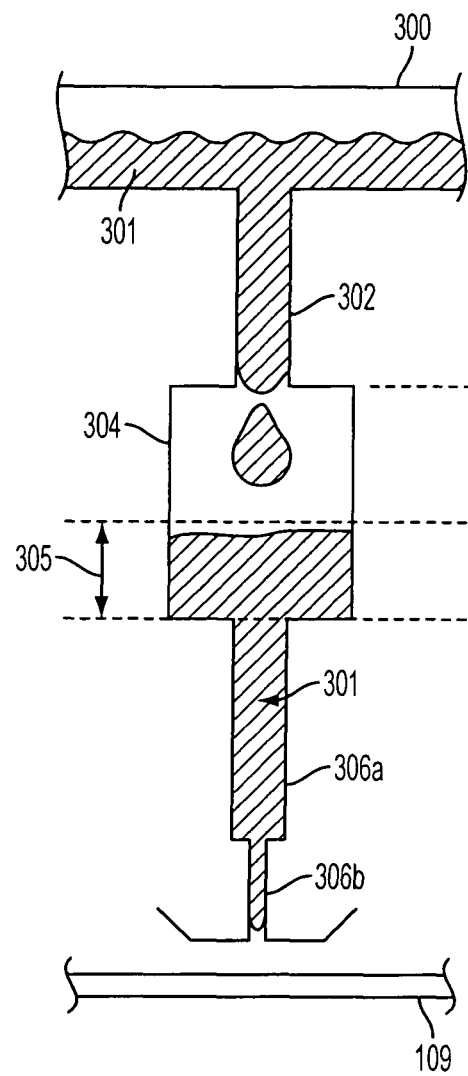
Figures 3, 3G, 4, 5, 6:
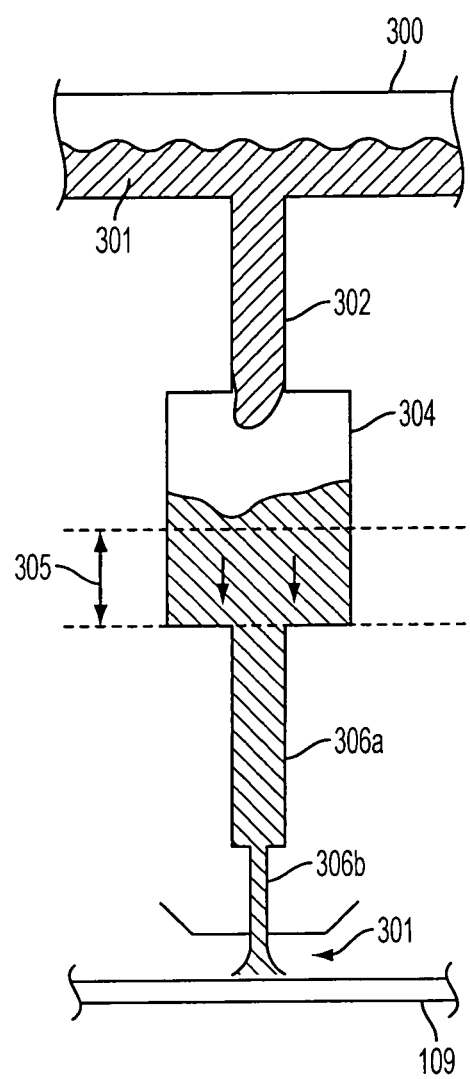
Figures 3, 3G, 4, 5, 6, 7:
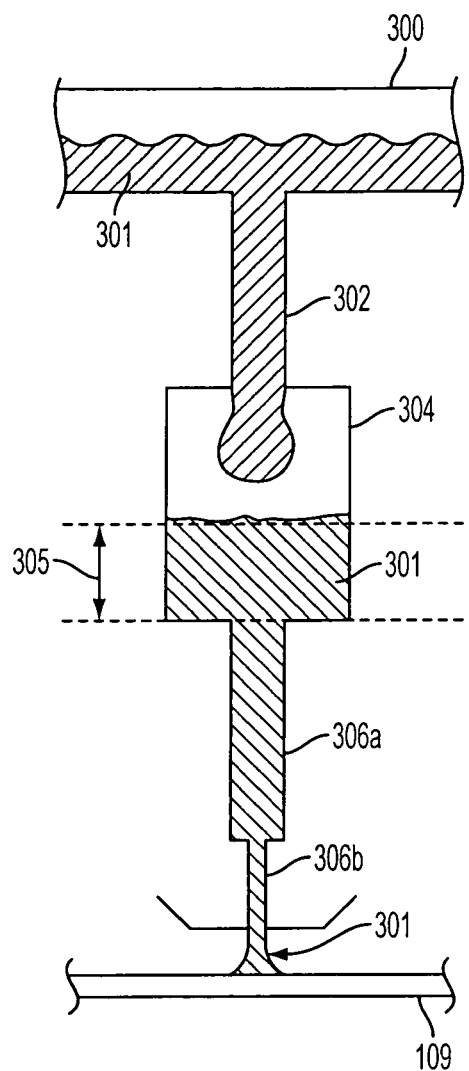
Figures 3, 3G, 4, 5, 6, 7, 8:
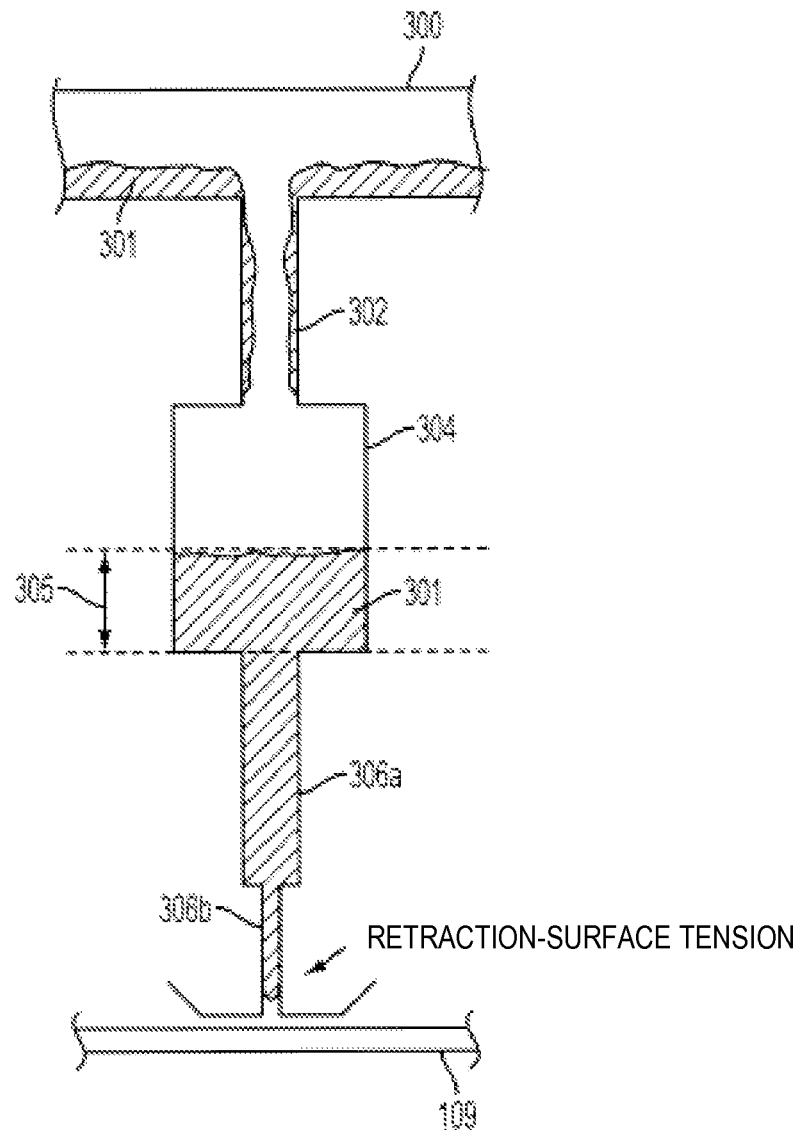
Figure 3H:
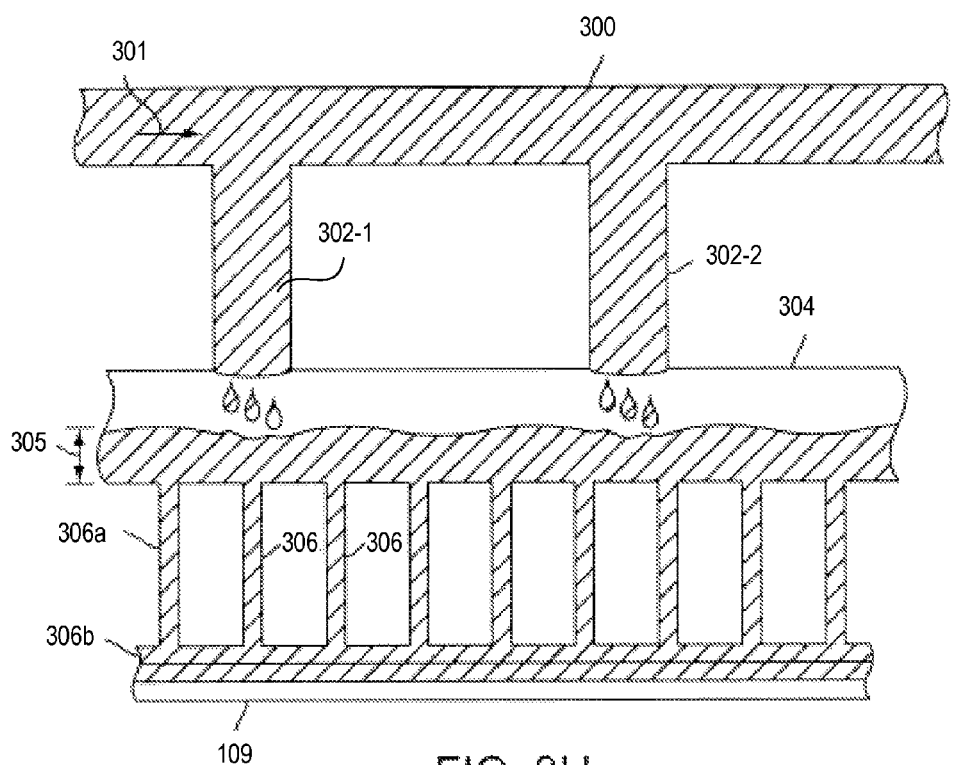
FIG. 3H is an exemplary cross-section view of a portion of the upper applicator 104a, in accordance with one embodiment of the present invention.

FIG. 3H is an exemplary cross-section view of a portion of the upper applicator 104a, in accordance with one embodiment of the present invention. Main bore 300 supplies fluid 301 first to feed 302-1 with a smaller cross-sectional area and then to feed 302-2. The fluid from the feeds 302-1 and 302-2 fill the reservoir 304 past the threshold height 305 initiating fluid flow through the outlets 306a to the outlet slot 306b that evenly dispenses a thin film of fluid onto the substrate 109. As fluid supplied by the feeds 302-1 and 302-2 maintain the fluid level within the reservoir above the threshold height 305, a steady flow of fluid from the outlet slot evenly coats the substrate. The smaller cross-sectional area of feed 302-1 restricts fluid flow from the feed to the reservoir. The larger cross-sectional area of feed 302-2 allows fluid flow from the feed to compensate for the temporal and volumetric difference incurred as feed 302-1 if supplied fluid earlier than feeds 302-2. The volumetric and temporal compensation from the various cross-sectional areas allows the reservoir 304 to be filled at a substantially constant rate across the width of the upper applicator. This results in fluid exceeding the threshold height 305 substantially simultaneously across the upper applicator and for the fluid to be dispensed as a thin film evenly across the substrate. In one embodiment, the gap between the substrate 109 and the outlet slot is about 0.5 mm. In other embodiments, the gap between the substrate 109 and the outlet slot varies between about 0.2 mm and about 0.8 mm. In one embodiment, an initial fluid flow rate through the main bore is about 500 cc/min and the substrate is transported by the substrate carrier at a speed between about 10 mm/sec and about 20 mm/sec. In other embodiments the carrier transports the substrate at a speed between about 5 mm/sec and 70 mm/sec. In one embodiment, the fluid flow rate during processing is between about 25 cc/min and 500 cc/minute.

FIG. 4A is a simplified illustration of fluid interfaces between the substrate 109, upper applicators 104a and 104b, and a lower applicator 400, in accordance with one embodiment of the present invention. In this embodiment, a lower applicator 400 applies a fluid 202' to the substrate 109 in a similar fashion to previously discussed upper applicator 104a. As the substrate 109 moves in direction 402, upper applicator 104a applies fluid 202 while lower applicator 400 applies fluid 202'. In some embodiments, fluids 202 and 202' can be identical while in other embodiments, fluids 202 and 202' can be different. The substrate 109 is cleaned and dried as it passes between upper applicator 104b and lower applicator 104b". In one embodiment, a rinse agent 204 is applied to the substrate 109 through ports 208. The rinse agent 204 is deionized water in one embodiment and mixtures of deionized water and isopropyl alcohol in other embodiments. A vacuum is drawn through ports 206 to remove the rinse agent 204 along with fluids 202 and 202' from the substrate 109.

FIG. 4B is a simplified perspective view of an exemplary lower applicator 400, in accordance with one embodiment of the present invention. The lower applicator 400 has a length L 407 defined between end 403 and end 403'. The length L 407 of the lower applicator 400 can be defined by the size of the substrate or the size of the process chamber. Fluids supplied by the lower manifold (not shown) are supplied through the end 403 of the lower applicator 400 and evenly distributed to the substrate through outlet slot 416. As the lower applicator 400 dispenses fluid to an underside of the substrate, excess fluid or fluid that does not adhere to the substrate is collected for recycling in collection area 410. Located within the collection area 410 are multiple return ports 413. Additional details of the return ports 413 will be discussed below.

Figure 4D:
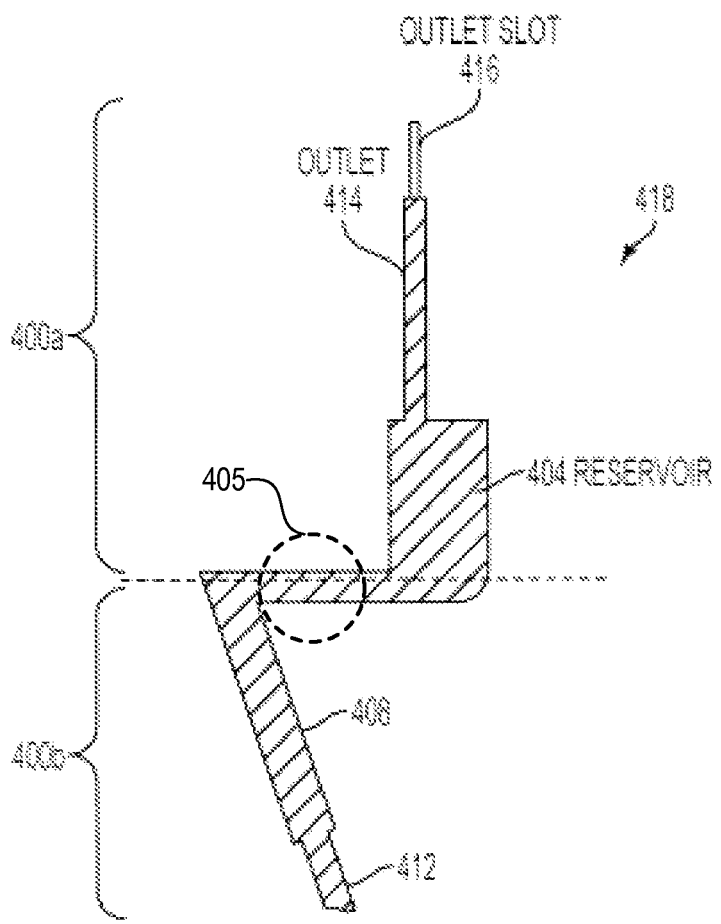
Figure 5:
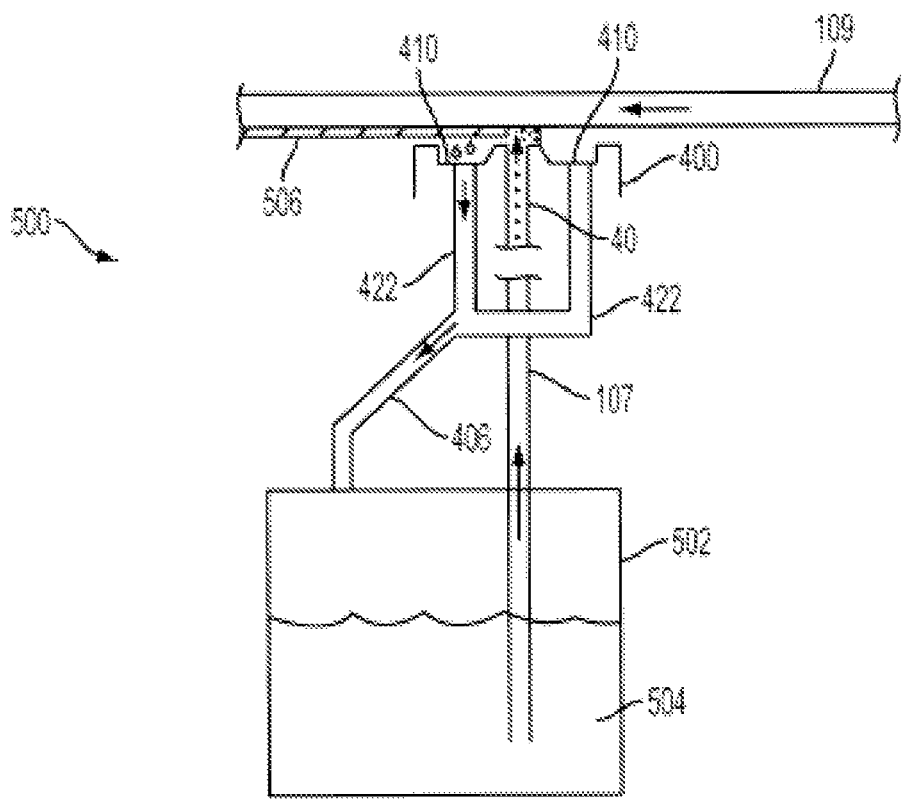

FIG. 4C is a diagram illustrating a cross-sectional area of the lower applicator 400 and FIG. 4D is a simplified schematic illustrating detail 418, in accordance with one embodiment of the present invention. Similar to the upper applicator, the lower applicator 400 includes a faceplate 400a and a body 400b. The body 400b includes the main bore 402, feeds 412, a reservoir 408, and a portion of a fluid resistor 405. The main bore 402 extends between ends of the lower applicators 400 and connects to the lower manifold (not shown). The reservoir 408 is substantially parallel to the main bore 402 and is connected to the main bore 402 by multiple feeds 412. Similar to feed size variations discussed in FIG. 3E, in one embodiment, the size of feeds 412 can be of various sizes to minimize flow rate variations along the length of the lower applicator 400. The body also includes return lines 406 that are substantially parallel to the main bore 402 and connect to return ports 413 via return feeds 422.

The faceplate 400a includes another portion of the fluid resistor 405, reservoir 404, outlet 414, outlet slot 416, and collection area 410. The fluid resistor 405 formed between opposing faces of the body 400b and the faceplate 400a regulates fluid flow from the reservoir 408 into the reservoir 404. Thus, in one embodiment, changing the size of the fluid resistor 405 along the length of the lower applicator 400 can be used to control fluid flow rates across the lower applicator 400. Multiple outlets 414 connect the reservoir 404 to the exterior of the faceplate. The outlet slot 416 joins all the multiple outlets to create a channel that evenly distributes the fluid to the underside of the substrate.

As the lower applicator 400 applies fluid to the underside of the substrate, there may be runoff fluid that drips from the substrate or does not adhere to the substrate. As some of the fluids can be expensive, the collection area 410 is used to collect runoff fluid for recycling. Within the collection area 410 are multiple return ports 413 that are connected to return feeds 422. The return feeds 422 are connected to return lines 406 that can be connected to a vacuum via the lower manifold (not shown). In other embodiment, the return lines are a gravity drain that function without a vacuum.

FIG. 5 is a simplified diagram illustrating a fluid recycling system used in conjunction with lower applicator 400, in accordance with one embodiment of the present invention. Tank 502 contains fluid 504 that is supplied to the lower applicator 400 via the lower manifold (not shown). For simplicity, internal details of the lower applicator 400 have been omitted. As previously discussed, the fluid 504 is supplied through the outlet slot and applied to as a thin film 506 on the substrate 109 as the substrate 109 passing over the lower applicator 400. Fluid that does not form part of the thin film 506 is contained within the collection area 410, and returned to the tank 502 via return ports, return feeds, and return lines.

The embodiment illustrated returns the fluid directly into the tank 502. In another embodiment, the fluid returning to the tank 502 is analyzed and processed before returning to the tank 502. Processing can include, but is not limited to filtering, buffering and conditioning.

Additional information regarding elements associated with the process module can be found in U.S. Provisional Patent Application No. 61/065,088 filed on Feb. 8, 2008, currently as U.S. application Ser. No. 12/367,515, filed on Feb. 7, 2009, now U.S. Pat. No. 8,317,966 titled "APPARATUS FOR SUBSTANTIALLY UNIFORM FLUID FLOW RATES RELATIVE TO A PROXIMITY HEAD IN PROCESSING OF A WAFER SURFACE BY A MENISCUS"; and U.S. application Ser. No. 10/330,843, filed Dec. 24, 2002, issued as U.S. Pat. No. 7,198,055, on Apr. 3, 2007, and entitled "MENISCUS, VACUUM, IPA VAPOR, DRYING MANIFOLD"; and U.S. application Ser. No. 10/330,897, filed Dec. 24, 2002, issued as U.S. Pat. No. 7,240,679, on Jul. 10, 2007, and entitled " SYSTEM FOR SUBSTRATE PROCESSING WITH MENISCUS, VACUUM, IPA VAPOR, DRYING MANIFOLD"; and U.S. patent application Ser. No. 11/552,794, filed on Oct. 25, 2006, issued as U.S. Pat. No. 7,874,260, on Jan. 25, 2011, and entitled " APPARATUS AND METHOD FOR SUBSTRATE ELECTROLESS PLATING" which are incorporated herein by reference.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A head for dispensing a thin film over a substrate, comprising:
a body assembly extending a length between a first and a second end that is at least a width of the substrate, the body including;
(a) a main bore defined between the first and the second ends within the head, the main bore connected to an upper side of a reservoir through a plurality of feeds that are defined between the main bore and the reservoir; and
(b) a plurality of outlets connected to a lower side of the reservoir and extending to an output slot that extends the length between the first and the second ends,
the plurality of feeds having a larger cross-sectional area than the plurality of outlets and
the plurality of feeds are fewer than the plurality of outlets,
wherein the main bore is parallel to the length of the body and perpendicular to the plurality of feeds and wherein fluid is configured to flow through the main bore, through the plurality of feeds along the bore and fill the reservoir up to at least a threshold level before fluid is evenly output as a film out of the output slot onto the substrate and cease to flow when the fluid level within the reservoir falls below the threshold level.

2. The head as described in claim 1, wherein groups of feeds within the plurality of feeds have different cross-sectional areas.

3. The head as described in claim 1, wherein the head further includes a faceplate.

4. The head as described in claim 3, wherein the body includes the main bore and the feeds and the face plate including the outlets and the outlet slot, and the reservoir is defined between the body and the face plate.

5. A head for dispensing a thin film over a substrate, comprising:
a upper body assembly and a lower body assembly extending a length between a first and a second end that is at least a width of the substrate, each of the upper body and the lower body assemblies including;
(a) a main bore defined between the first and the second ends within the head, the main bore connected to a first side of a reservoir through a plurality of feeds that are defined between the main bore and the reservoir;
(b) a plurality of outlets connected to a second side of the reservoir and extending to an output slot, wherein the first side is opposite to the second side of the head, the plurality of feeds having a larger cross-sectional area than the plurality of outlets and the plurality of feeds are fewer than the plurality of outlets,
wherein the main bore is parallel to the length of the body and perpendicular to the plurality of feeds and wherein fluid is configured to flow through the main bore, through the plurality of feeds along the bore and fill the reservoir up to at least a threshold level before fluid is evenly output as a film out of the output slot onto the substrate;
(c) a fluid resistor defined in the lower body assembly, the lower body assembly including a faceplate and a body, wherein the fluid resistor is defined between opposing faces of the body and the faceplate, size of the fluid resistor configured to control fluid flow rates across the lower body assembly; and
(d) a collection area having a plurality of return ports to collect run-off fluid, the return ports connected to a tank supplying the fluid to the lower body assembly through return feeds and return lines.

6. The head of claim 5, further includes a fluid recycling system connected to the tank, the fluid recycling system is configured to collect the run-off fluid, analyze and process the run-off fluid prior to returning to the tank.

* * * * *